(12) United States Patent
Shaeffer et al.

(10) Patent No.: US 6,460,170 B1
(45) Date of Patent: Oct. 1, 2002

(54) CONNECTION BLOCK FOR INTERFACING A PLURALITY OF PRINTED CIRCUIT BOARDS

(75) Inventors: Ian P. Shaeffer, San Jose; Everett Basham, Sunnyvale, both of CA (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/561,808

(22) Filed: Apr. 29, 2000

(51) Int. Cl.[7] .............................................. G06F 17/50
(52) U.S. Cl. ................. 716/15; 257/2; 257/8; 257/9; 438/7; 438/8; 438/9; 438/10; 361/704; 361/707; 361/719; 361/720
(58) Field of Search ........................... 716/1–21; 257/2, 257/8, 9; 438/7–10; 361/707, 704, 719, 720

(56) References Cited

U.S. PATENT DOCUMENTS

| | | | |
|---|---|---|---|
| 5,646,826 A | 7/1997 | Katchmar | 361/704 |
| 5,661,902 A | 9/1997 | Katchmar | 361/719 |
| 5,777,844 A | 7/1998 | Kiefer | 361/720 |

*Primary Examiner*—Vuthe Siek
*Assistant Examiner*—Thuan Do

(57) ABSTRACT

A system and method is described for providing a robust mechanical and electrical connection between two or more circuit boards which may be employed for diagnostic purposes and/or for permanent connections. A spacer block, connection block, or pedestal, preferably made of PCB type material is preferably disposed between two PCBs. The pedestal is preferably dimensioned to space the two PCBs far enough apart that the surface mount components on two boards connected employing the inventive pedestal do not interfere with one another. The pedestal preferably provides for ample signal density and signal quality because of the block thickness and availability of insulation within the pedestal.

12 Claims, 2 Drawing Sheets

CONNECTION BLOCK FOR INTERFACING A PLURALITY OF PRINTED CIRCUIT BOARDS

BACKGROUND

When designing large computer systems it is desirable to establish connections between various printed circuit boards (PCBs) within the computer system. Historically, specialized connectors have been designed to accomplish the purpose of connecting various circuit boards together. Such connectors are generally designed to conform to the particular electrical and geometric requirements of a particular computer system layout. A problem with this approach is that considerable design time may be expended designing such connectors in such a way as to not disturb the signals being transmitted along high speed connections. Such connectors have been increasingly used for debugging operations for various functions, such as, for example, connecting a system under test to a logic analyzer for diagnostic purposes. However, since the connections in question are generally performed primarily during diagnostic operations, there is generally no space on the PCBs dedicated for such connections. This lack of space arises because the boards are designed with their ultimate operation in mind at which time diagnostic operations are usually not conducted. Moreover, connectors added for diagnostic purposes may degrade signal integrity by introducing inductances and capacitances into various signal paths.

As a result, later prior art solutions used temporary connections between PCBs known as flex circuits. FIG. 1 depicts deployment of flex circuit 102 in order to establish connections to a circuit board 101 for diagnostic purposes. Signal transmission generally proceeds from PCB 101 through interposer 105, which generally includes an array of conductive or resistive contacts, to flex circuit 102 and presented at connector 103 for connection to other circuit boards in a computer system. Although flex circuit 102 appears as a line in the cutaway view of FIG. 1, flex circuit 102 generally has a planar shape substantially matching the two dimensional footprint of interposer 105 and its associated array of conductive elements. The two dimensional shape of flex circuit 102 would generally be visible when viewed from above.

Flex circuit 102 is generally held in place with back plate 104 which is secured employing bolts 106. The portion of flex circuit 102 which extends beyond the back plate 104 is generally flexed upward to avoid contact with surface mount components 107 and generally terminates at connector 103 which may be employed to transmit signals originating in PCB 101 to other circuit boards in a computer system.

A problem which generally arises with the use of flex circuits is that the flexibility of the circuit generally requires that the material be kept quite thin. The thinness of the material tends to limit the number of signal layers, and thus the number of signals which may be transmitted along the flex circuit and tends to compromise the resulting signal quality. Accordingly, it is a limitation of the use of flex circuits that the number of signals which may be transmitted from circuit board to other parts of a computer system is limited. Moreover, the construction of the flex circuit precludes the use of a sufficient amount of protective material on either side of the conductive material, thereby generally compromising the signal integrity of the flex circuit transmission. Flex circuits may be also be difficult to obtain due to their specialized designs and difficulty of manufacture.

Another approach to the connection of printed circuit boards was to directly attach two circuits boards back to back employing an interposer disposed between the two boards. This was possible many years ago because the socket technologies were thicker than they are today, and the distance between the boards was therefore sufficient to avoid interference between surface mount components on the two boards. However, the thinness of socket technologies in use today makes such direct back to back PCB connection impractical.

Therefore, it is a problem in the art that space is usually not provided on a printed circuit board for connectors dedicated to diagnostic operations.

It is a further problem in the art that dedicated diagnostic connectors generally compromise signal integrity by introducing additional inductance and capacitance along the signal paths.

It is a still further problem in the art that flex circuits generally do not provide enough signal density to transmit a sufficient number of signals from a modem printed circuit board.

It is a still further problem in the art that flex circuits generally cause signal degradation because of a lack of sufficient shielding and dielectric of the conductive portion of the flex circuit structure.

SUMMARY OF THE INVENTION

These and other objects, features and technical advantages are achieved by a system and method which disposes a pedestal between two PCBs to provide for secure mechanical attachment of, and robust electrical connection between, the two PCBs. The pedestal is preferably dimensioned so as to space the two boards sufficiently far apart that even the tallest surface mount components on each board which point toward the attached board will not contact one another.

In a preferred embodiment, the pedestal has a generally rectangular cross section for convenience of manufacturing and is made of materials typically used for the production of PCBs themselves, such as, for instance, FR4, TEFLON®, polyimide, Gore-Tex®, epoxy impregnated expanded PTFE (TEFLON®), GETEK®, RU-DUROID®, and fiberglass-epoxy.

Effectively, the pedestal may operate as a special purpose printed circuit board, which instead of supporting a variety of different surface mount components, is primarily dedicated toward providing a mechanically and electrically robust connection between two general purpose circuit boards. However, small parts, very fast parts (rapidly responsive parts), and passive components including passive resistors could be disposed either on, or within the pedestal and all such variations are included within the scope of the present invention.

In a preferred embodiment, the pedestal is designed with sufficient thickness to allow for a far greater number of signal layer paths therein than was available with flex circuits or with connectors of the prior art. Moreover, the thickness of the pedestal enables ample protection of the conductive paths to be installed, thereby providing for much improved signal integrity over the flex circuits of the prior art. The pedestal may generally be manufactured separately from the other PCBs and then affixed to them at a convenient point in the production process. Connection between the general purpose PCBs and the pedestal may be made employing land grid arrays. Alternatively, the inventive mechanism could deploy ball grid arrays, or other form of conductive interposer or conductive interface. In a preferred embodiment, in view of the sturdiness, signal efficiency, and signal integrity of the inventive pedestal, the pedestal may be appropriate for both diagnostic purposes as well for permanent installation between the two circuit boards. In a preferred embodiment, additional benefit may be obtained from deployment of the inventive pedestal by disposing it on a general purpose PCB directly opposite an ASIC (Application Specific Integrated Circuit) installed on the opposite side of the same general purpose PCB. Generally, general purpose circuit boards incorporate particularly high density signal routing in the vicinity of ASIC connections because of the number of signals traveling in both directions near an ASIC attachment. Substantial economy of design and resources may be obtained by disposing the inventive pedestal and an ASIC on opposite sides of the same region of high density signal routing. Since many signals with destinations outside a PCB originate from ASICs, the conductive path and signal integrity between an ASIC and its destination may be improved by locating the ASIC opposite a pedestal, which is in turn preferably disposed in close proximity to another printed circuit board.

Furthermore, due to the improved quality of PCB to PCB signal connection provided by the inventive pedestal in comparison with the prior art, circuit connections which previously had to be entirely disposed on a single PCB may potentially be spread out between two or more PCBs when using the inventive pedestal, thereby providing greater flexibility in PCB circuit design.

An alternative approach to providing appropriate spacing between circuit boards while providing sufficient signal transmission quality is to generate a three dimensional circuit board design which provides a protrusion on one or more surfaces of the circuit board through milling or other process which rises substantially above the rest of the circuit board surface which protrusion is used for attachment to another circuit board. The protrusion is preferably thick enough that surface mount components on the board do make contact with a board attached to the surface of the protrusion. A problem in providing the above protrusion is that the cost producing boards having such protrusions are generally prohibitive because of the low production yield. Another problem is that holes drilled for vias in the region of the board having the protrusion generally need to be wider in order to sustain an acceptable yield rate with a thicker board. Finally, the described milling process generally experiences a fairly low yield rate due to the difficulty of the process involved.

Accordingly, it is an advantage of a preferred embodiment of the present invention that a robust mechanical attachment between two circuit boards is provided by the inventive pedestal.

It is a further advantage of a preferred embodiment of the present invention that the inventive pedestal provides greater signal density as well as greater signal integrity than the flex circuits and other approaches of the prior art.

It is a still further advantage of a preferred embodiment of the present invention that the inventive pedestal may be suitable for permanent placement between two circuit boards as well as for diagnostic purposes.

It is a still further advantage of a preferred embodiment of the present invention that economy of effort in PCB design may be obtained by placing the inventive pedestal opposite a location of installation of an ASIC attached to the same PCB.

It is a still further advantage of a preferred embodiment of the present invention that the quality of signal transmission through the inventive pedestal preferably enables greater flexibility in the distribution of circuit components among a plurality of circuit boards.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
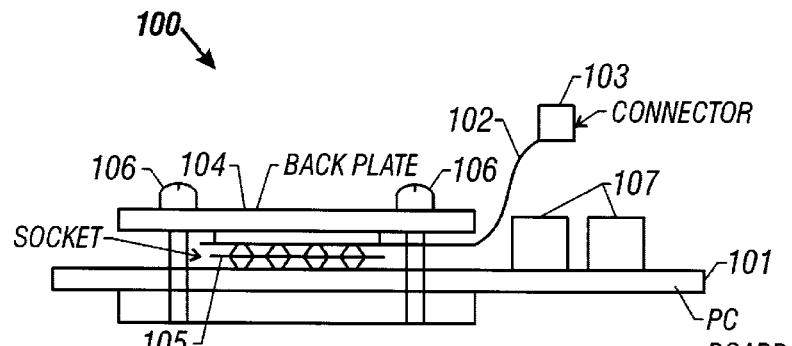
FIG. 1 depicts deployment of flex circuit in order to establish connections between different circuit boards in a computer system.
Figure 2:
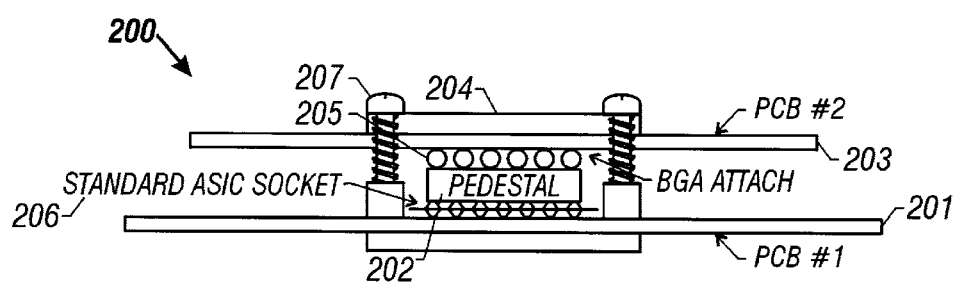
FIG. 2 depicts a pedestal disposed between two printed circuit boards according to a preferred embodiment of the present invention.

FIG. 2 depicts a pedestal disposed between two printed circuit boards 101, 102 according to a preferred embodiment of the present invention.

In a preferred embodiment, pedestal 202 is disposed between PCB 1 201 and PCB 2 203 with these and other layers held in place by bolts 207 and compression plate 204. Of course, means of attachment other than bolts including, clips, clamps, screws, and pins may be employed, and all such variations are included within the scope of the present invention. Conductive or resistive mechanisms are preferably disposed at the interfaces between PCB 1 201 and the pedestal 202 and between the pedestal 202 and PCB 2 203. Standard ASIC socket 206 is shown providing a conductive interface between PCB 1 201 and pedestal 202, while a ball grid array attachment 205 is shown at the interface between pedestal 202 and PCB 2 203.

It will be appreciated that a range of different conductive mechanisms or conductive or resistive interfaces or interposers may be employed at either of the two PCB-pedestal interface locations and all such variations are included within the scope of the present invention. Conductive mechanisms which may be employed include but are not limited to: metallized polymer interposer, ball grid arrays, land grid arrays coupled with an appropriate connection mechanism, and spring loaded pogo pins which couple with corresponding contacts.

In a preferred embodiment, the thickness of pedestal 202 is such that PCB 1 201 and PCB 2 203 are spaced far enough apart that surface components (not shown) on the two boards do not make contact when pedestal 202 is properly in place between the two PCBs. The other dimensions of pedestal 202 are preferably flexible depending upon the application. The availability of real estate on the printed circuit boards 201 and 203, the number of electrical connections which will be made through pedestal 202, and the amount of dielectric employed to protect the conductive paths within pedestal 202 may all be factors in determining the width and length of pedestal 202.

In a preferred embodiment, the structure of pedestal 202 is substantially that of a special purpose printed circuit board. Generally, pedestal 202 is provided with a rectangular footprint and may be fabricated employing materials which are the same or similar to those employed in the manufacture of general purpose PCBs, such as, for instance, FR4, TEFLON®, polyimide, Gore-Tex®, epoxy impregnated expanded PTFE (TEFLON®), GETEK®, RU-DUROID®, and fiberglass-epoxy. Although pedestal 202 may generally be provided with a rectangular layout (footprint), the inventive pedestal may assume any shape and remain within the scope of the present invention. Electrical transmission through pedestal 202 may also be provided in a manner similar to that provided in general purpose printed circuit boards. For example, conductive landings may be provided on the upper and lower surfaces of pedestal 202 which are coupled to vias for providing electrical conductance between the two surfaces of pedestal 202. Vias may be provided in various forms within pedestal 202 including but not limited to: through-hole vias, blind vias, and buried vias. Moreover, parts, including but not limited to electronic components, may be disposed within vias of any of the above-listed varieties of vias.

In a preferred embodiment, the thickness of pedestal 202 is such as to enable ample insulation of the conductive paths connecting the two surfaces of pedestal 202, and thereby the two PCBs connected to pedestal 202. The conductive paths are thereby preferably able to provide a high level of signal integrity for electrical communication transmitted through pedestal 202. The thickness of pedestal 202 also preferably allows for room to permit a number of signal layers within pedestal 202, thereby providing for considerably greater signal density, or bandwidth, than was available with prior art approaches.

Preferably, one by-product of the improvement in signal quality or integrity through pedestal 202, is that circuit sub-systems which previously had to be located on a single PCB because the loss of signal integrity when employing connectors between two PCBs may located on two or more PCBs when these PCBs are connected employing one or more inventive pedestals. The pedestal 202 may thereby operate to remove a burdensome design constraint, reduce design time, and remove the burdensome need to incorporate an entire circuit sub-system on a single chip. It will be appreciated that two general purpose PCBs are shown joined by one pedestal in the embodiment depicted in FIG. 2 such PCBs may be joined by any number of pedestals, and all such variations are included in the scope of the present invention.

In a preferred embodiment, pedestal 202 forms a permanent attachment with one PCB and is joined with the other employing a more easily removable connection to another. Alternatively, both connections could be permanent, or both easily removable, and all such variations are included within the scope of the present invention. In FIG. 2, ball grid array connection 205 between pedestal 202 and PCB 2 203 generally serves as a permanent (low inductance) connection, while a socket connection 205, which is preferably a metalized polymer socket interposer is shown at the interface between pedestal 202 and PCB 1 201. An optional additional step which may be performed to add stability to the soldered connection between pedestal 202 and PCB 2 is to add non-conductive epoxy to the soldered connection to lend strength to this connection to prevent breakage or deformation of the solder under compression.

Figure 3:
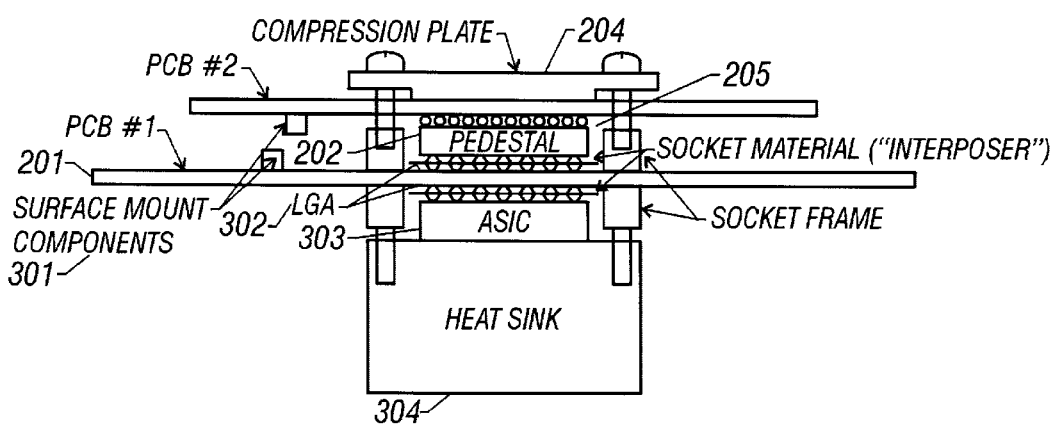
FIG. 3 depicts an ASIC and a pedestal disposed opposite one another on the same printed circuit board according to a preferred embodiment of the present invention.

FIG. 3 depicts an ASIC 303 and a pedestal 202 disposed opposite one another on the same printed circuit board 201 according to a preferred embodiment of the present invention. The embodiment of FIG. 3 adds an ASIC to the embodiment shown in FIG. 2. ASIC 303 is preferably connected to PCB 1 201 opposite pedestal 202. Substantial economy of effort and synergy may be effected by connecting ASIC 303 and pedestal 202 in this manner. Preferably, matching LGAs (land grid arrays) 302 are employed to connect pedestal 202 and ASIC 303, respectively, to PCB 1 201. Preferably, the use of matching LGAs in this manner enables the same LGA artwork to be used for both LGAs, thereby providing conservation of design time.

In a preferred embodiment, the area on PCB 1 201 to which ASIC 303 would be attached would generally be configured with provision for high density electrical signal connections. Accordingly, connecting pedestal 202 directly opposite ASIC 303 on PCB 1 201 operates to efficiently employ the high density connection area on PCB 1 201 for attachment of two devices instead of one, thereby providing added efficiency. Such proximate attachment of ASIC 303 to pedestal 202 also preferably beneficially reduces signal path length and associated disruptions in signal integrity for signals traveling to and from ASIC 303 through pedestal 202.

As in FIG. 2, pedestal 202 is shown connected to compression plate 204 employing a solder ball grid array 205. However, it will be appreciated than any of the connections between PCB 2 203 and pedestal 202, between PCB 1 201 and pedestal 202, and PCB 1 201 and ASIC 303 may be established employing a range of connection mechanisms including but not limited ball grid arrays, land grid arrays, metalized polymer interface interposer, and pogo pins or other spring metallic contacts. Connection 205 is shown employing a ball grid array because generally the pedestal is substantially permanently attached to one of the PCBs, which in the embodiment of FIG. 3, is PCB 2 203. Alternatively however, pedestal 202 could be permanently attached to both PCBs, or to neither PCB, and all such variations are included in the scope of the present invention.

Figure 4:
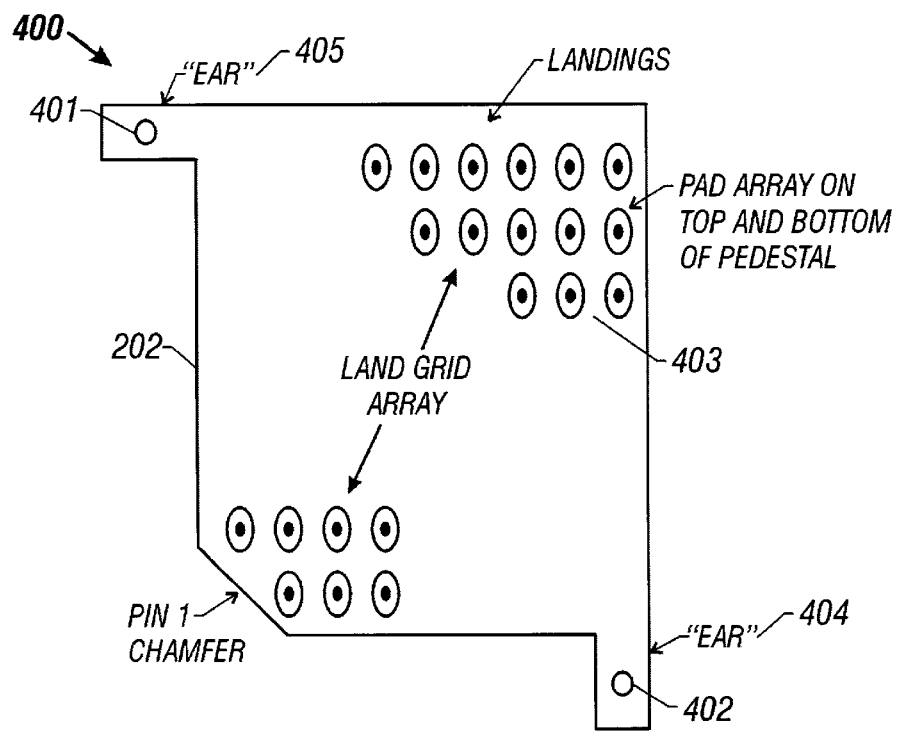
FIG. 4 depicts a top view of the inventive pedestal according to a preferred embodiment of the present invention.

FIG. 4 depicts a top view 400 of the inventive pedestal 202 according to a preferred embodiment of the present invention. Pedestal 202 preferably boasts a footprint (two dimensional shape in the view of FIG. 4) substantially matching that of a typical ASIC 303 which may be attached to any of the general purpose printed circuit boards employed in a computer assembly. Preferably, pad array 403 is suitable for connection to a land grid array or other conductive mechanism for insertion in between pedestal 202 and one of the general purpose printed circuit boards 201 and 203. Holes 401 and 402 are preferably employed to properly align pedestal 202 with a printed circuit board to which it is being attached. Ears 404 and 405 are also optionally provided to aid in properly aligning pedestal 202. It will be appreciated that ears 404 and 405 as well as holes 401 and 402 are both optional in the design of pedestal 202.

Figure 5:
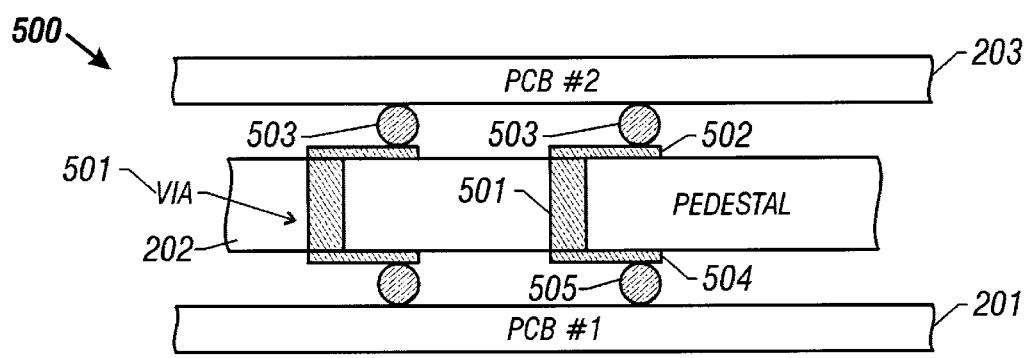
FIG. 5 is a cross-sectional view of a pedestal including through hole vias according to a preferred embodiment of the present invention.

FIG. 5 is a cross-sectional view 500 of a pedestal including through hole vias 501 according to a preferred embodiment of the present invention. Preferably, a typical conductive path for signals traveling through pedestal 202 would be from PCB 2 203 through solder connection 503, to conductive landing 502, along through-hole via 501 onto a lower landing 504 through another solder connection 505 and on to PCB 1 201. It will be appreciated that a range of conductive or resistive connection mechanisms could be employed in place of solder connections 502 and 504, as discussed elsewhere in this application, and all such variations are included within the scope of the present invention. Other via configurations may be employed as well as shown in FIG. 6.

Figure 6:
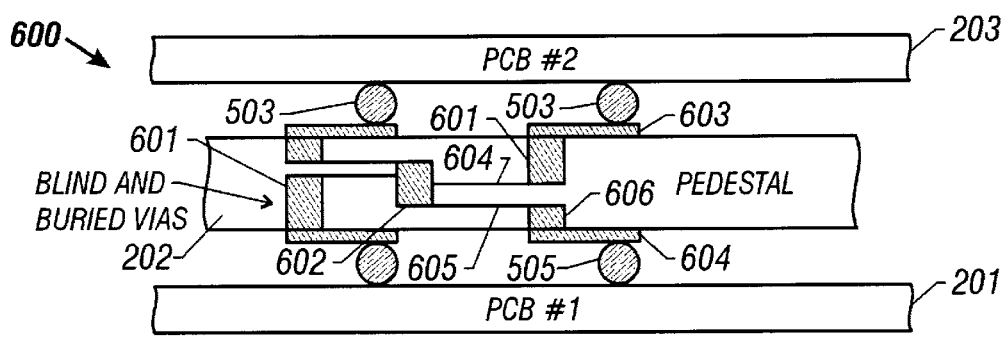
FIG. 6 is a cross-sectional view of a pedestal including blind vias according to a preferred embodiment of the present invention.

FIG. 6 is a cross-sectional view 600 of a pedestal 202 including blind and buried vias according to a preferred embodiment of the present invention. The embodiment of FIG. 6 augments the embodiment depicted in FIG. 5 by including both blind vias and buried vias as well as through-hole vias as parts of a conductive path through pedestal 202. One possible conductive path between PCB 2 203 and PCB 1 201 proceeds through solder connection 503 to conductive landing 603, along blind via 601, then along conductive layer 604 to buried via 602, along second conductive pad 605, along blind via 606, to conductive landing 604, through solder connection 505, and onto PCB 1 201. It will be appreciated that numerous conductive connections could be made in place of solder connections 503 and 505, as discussed elsewhere in this application, and that all such variations are included in the scope of the present invention. Moreover, the sequence of vias depicted in FIG. 6 is exemplary. Numerous combinations and sequences of vias of various kinds including through-hole vias, blind vias, and buried vias may be employed in combination with various conductive or resistive layers and landings, in configurations varying from those depicted in FIG. 6, and all such variations are included in the scope of the present invention.

In an alternative embodiment, the inventive pedestal is not limited to being a substantially flat specialized PCB with a rectangular footprint which interfaces general purpose PCBs which are aligned parallel to each other. Alternative designs could include pedestals which connect printed circuit boards at various distances and relative orientations with respect to each other. For example, a pedestal could be configured in the shape of an angle bracket which connects two PCBs oriented ninety degrees apart. The angle bracket shaped pedestal could form electrical connections either through the side of each PCB, or as in the preferred embodiment, employing an interface on one or more surfaces of the PCB. Preferably, other relative orientations of PCBs could be accommodated by the inventive pedestal.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. Apparatus for connecting a plurality of printed circuit boards to provide robust mechanical and electrical attachment of said circuit boards, the apparatus comprising:
    a spacer block dimensioned to provide separation between first and second printed circuit boards sufficient to prevent interference between surface mount components mounted to said first and second printed circuit boards;
    first and second surfaces of said spacer block configured for electrical connection, respectively, to said first and second printed circuit boards; and
    conductive paths through said spacer block insulated so as to provide high signal integrity for communication between said first and second printed circuit boards.

2. The apparatus of claim 1 further comprising:
    a first interposer disposed between said first surface of said spacer block and said first printed circuit board; and
    a second interposer disposed between said second surface of said spacer block and said second printed circuit board.

3. The apparatus of claim 1 wherein at least one of said conductive paths within said spacer block comprises:
    conductive landings disposed on said first and second surfaces of said spacer block.

4. The apparatus of claim 1 wherein at least one of said conductive paths within said spacer block comprises:
    a through-hole via for conducting electrical signals through said spacer block.

5. The apparatus of claim 1 wherein at least one of said conductive paths within said spacer block comprises:
    at least one conductive layer linking a plurality of vias within said spacer block.

6. The apparatus of claim 1 wherein said spacer block is parallel to said first and second printed circuit boards and has a substantially rectangular footprint.

7. The apparatus of claim 1 further comprising:
    dielectric material disposed within said spacer block for protecting said conductive paths thereby providing high signal integrity for signals transmitted through said spacer block.

8. The apparatus of claim 1 further comprising:
    an ASIC disposed on a surface of said first printed circuit board opposite a region of attachment of said spacer block, thereby providing a short and direct signal path for communication to and from said ASIC traveling through said spacer block.

9. The apparatus of claim 1 wherein said spacer block is composed substantially of a material selected from the group consisting of: polytetrafluoroethylene, FR4, and polyimide.

10. A system for providing a compact connection between a plurality of printed circuit boards, the system comprising:

means for separating first and second printed circuit boards employing a connection block, wherein said separation is sufficient to prevent any mechanical interference between components mounted to said first and second printed circuit boards;

means for disposing said connection block and said first and second printed circuit boards within a sturdy compact mechanical assembly; and means for providing high density and high integrity signal transmission between said first and second printed circuit boards through said connection block.

11. The system of claim 10 wherein said means for disposing comprises:

means for aligning said connection block, said first printed circuit board, and said second printed circuit board substantially parallel to one another; and means for establishing substantially full surface contact, between first and second surfaces of said connection block and said first printed circuit board and said second printed circuit board, respectively.

12. The system of claim 10 wherein said means for providing comprises:

means for receiving signal transmission on said first and second surfaces of said connection block; and means for conducting said signal transmission through a thickness of said connection block between signal transmission means on said first and said second surfaces of said connection block.

* * * * *